(12) United States Patent
Bucksch

(10) Patent No.: US 10,438,680 B2
(45) Date of Patent: Oct. 8, 2019

(54) NON-VOLATILE MEMORY TESTING

(71) Applicant: Infineon Technologies AG, Neubiberg (DE)

(72) Inventor: Thorsten Bucksch, Munich (DE)

(73) Assignee: Infineon Technologies AG, Neubiberg (DE)

( * ) Notice: Subject to any disclaimer, the term of this patent is extended or adjusted under 35 U.S.C. 154(b) by 90 days.

(21) Appl. No.: 15/639,687

(22) Filed: Jun. 30, 2017

(65) Prior Publication Data

US 2018/0047458 A1    Feb. 15, 2018

(30) Foreign Application Priority Data

Aug. 10, 2016 (DE) .................. 10 2016 114 795

(51) Int. Cl.
*G11C 29/00* (2006.01)
*G11C 29/38* (2006.01)
*G11C 29/36* (2006.01)
*G11C 29/04* (2006.01)
*G11C 29/26* (2006.01)

(52) U.S. Cl.
CPC .............. *G11C 29/38* (2013.01); *G11C 29/36* (2013.01); *G11C 2029/0401* (2013.01); *G11C 2029/2602* (2013.01); *G11C 2029/3602* (2013.01)

(58) Field of Classification Search
None
See application file for complete search history.

(56) References Cited

U.S. PATENT DOCUMENTS

| | | | |
|---|---|---|---|
| 6,728,916 B2* | 4/2004 | Chen ................. | G06F 11/27 714/724 |
| 2002/0178414 A1* | 11/2002 | Roohparvar ....... | G11C 29/1201 714/718 |
| 2004/0268181 A1* | 12/2004 | Wang ............ | G01R 31/318586 714/30 |
| 2011/0066872 A1* | 3/2011 | Miller ................ | G06F 1/30 713/340 |
| 2013/0036254 A1* | 2/2013 | Fai .................... | G06F 11/263 711/103 |
| 2018/0047458 A1* | 2/2018 | Bucksch .............. | G11C 29/38 |

FOREIGN PATENT DOCUMENTS

DE    60212962 T2    1/2007

OTHER PUBLICATIONS

Office Action, in the German language, from counterpart German Application No. 102016114795.8, dated Jun. 8, 2017, 6 pp.

* cited by examiner

*Primary Examiner* — Daniel F. McMahon
(74) *Attorney, Agent, or Firm* — Shumaker & Sieffert, P.A.

(57) ABSTRACT

Devices, systems and methods are provided which comprise testing of a non-volatile memory concurrently during at least a part of a testing of other system parts by a processor. In some examples, a device includes a processor, a non-volatile memory, a test controller, and at least one further circuit part. In a test mode, the processor is configured to test the at least one further circuit part, and wherein the test controller is configured to test the non-volatile memory concurrently with at least part of the testing of the at least one further circuit part.

20 Claims, 6 Drawing Sheets

| Field width (bits) Command Code | 3b Command | 2b Data | 2b Page Ctr | 2b Sector Ctr | 4b Rel. Address |
|---|---|---|---|---|---|
| 0 | NOP | 0 = nop<br>1 = shift left<br>2 = shift right | 0 = nop<br>1 = incr<br>2 = decr<br>3 = on carry sectorctr | 0 = nop<br>1 = incr<br>2 = decr<br>3 = on carry pagectr | x |
| 1 | Erase | 0 = page<br>1 = sector<br>2 = all | | | |
| 2 | Read | 0 = datareg | | | |
| 3 | Write | 1 = !datareg<br>2 = solid 0<br>3 = solid 1 | | | |
| 4 | Jump | 0 = condition met page & sector<br>1 = condition met page & !sector<br>2 = condition met !page & !sector | 0 = unconditional<br>1 = carry | 0 = unconditional<br>1 = carry | -12..3 |
| 5 | Load | 0 = nop<br>1 = load | 0 = nop<br>1 = load | 0 = nop<br>1 = load sector & nvm area | x |
| 6 | Reset all ctrs | 0 = nop<br>1 = load datareg | | | x |

Fig. 7

March 5N

| Command | Data | Page Ctr | Sector Ctr | Data Register | Address |
|---|---|---|---|---|---|
| Reset all ctrs | x | x | x | | |
| Erase | all | | | x | |
| Read | datareg | const | const | | |
| Write | !datareg | incr | incr on carry | 0x55 | |
| Jump | condition met page & !sector | uncond | carry | 0x55 | -2 |
| Read | !datareg | const | const | | |
| Write | datareg | incr | incr on carry | 0x55 | |
| Jump | condition met page & !sector | uncond | carry | 0x55 | -2 |
| Read | datareg | const | const | | |
| Jump | condition met page & !sector | uncond | carry | 0x55 | -1 |

Fig. 8

NON-VOLATILE MEMORY TESTING

TECHNICAL FIELD

The present application relates to devices, methods and systems related to the testing of non-volatile memories.

BACKGROUND

System-on-Chips (SoC) provide various functionalities on a single chip. Typical components of a such System-on-Chips may comprise a processor, an oscillator, output drivers, and/or analog or digital input. Furthermore, System-on-Chips often comprise embedded non-volatile memories, for example flash memories. Such non-volatile memories are used e.g. for storing program parts or data for a processor of the System-on-Chip. Non-volatile memories also allow the usage of device feature configuration by updating the non-volatile memory, storage of permanent data and application codes. Typical non-volatile memories include flash memories, EPROMS (electrically programmable read only memories) or EEPROMS (electrically erasable programmable read only memories), but are not limited thereto.

The size of such non-volatile memories provided on System-on-Chips has been increasing over time. For example, new features like safety features and software frameworks in the automotive industry like AUTOSAR (automotive open system architecture) require increasing memory space for data and software code.

System-on-Chips generally are tested during a production test. Non-volatile memories like flash memories have comparatively slow access times, in particular slow write access, compared to other memory types like random access memories (RAM), read-only memories (ROM) or dynamic random access memories (DRAM). Therefore, testing of flash memories takes quite a long time. For example, for an embedded power integrated circuit SoC with 128 kB flash memory a test time for the flash memory in a backend test flow may be up to about 30% of the total test time. Increased test times result in increased production costs.

It is therefore an object to provide devices and methods enabling a reduction of an overall test time.

SUMMARY

According to an embodiment, a device is provided, comprising:
a processor,
a non-volatile memory,
a test controller, and
at least one further circuit part,
wherein, in a test mode, the processor is configured to test the at least one further circuit part, and wherein the test controller is configured to test the non-volatile memory concurrently with at least part of the testing of the at least one further circuit part.

According to another embodiment, a System-on-Chip is provided, comprising:
a microcontroller,
a flash memory,
further circuits, and
a built-in self-test controller,
wherein the built-in self-test controller is configured to test the flash memory at least in part concurrently to the microcontroller testing at least some of the further circuits.

According to another embodiment, a method is provided, comprising:
testing system parts using a processor, and
testing a non-volatile memory concurrently during part of the testing of the system parts.

The above summary is merely intended to give a brief overview over some features of some embodiments and is not to be construed as limiting. In particular, other embodiments may have other features than the ones discussed above.

BRIEF DESCRIPTION OF THE DRAWINGS

FIG. 7 is a table illustrating commands usable for testing non-volatile memory according to some embodiments.

FIG. 8 illustrates a code for a test procedure using the commands of FIG. 7 according to some embodiments.

DETAILED DESCRIPTION

Figure 1:
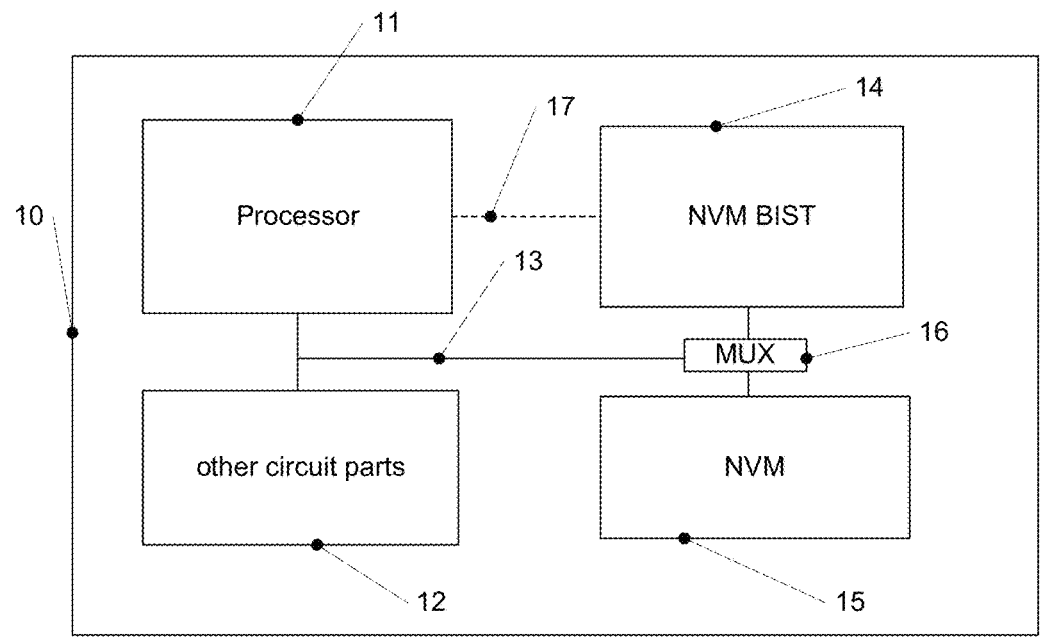
FIG. 1 is a block diagram of a device according to an embodiment.

In the following, various embodiments will be described in detail referring to the attached drawings. These embodiments are given by way of example only and are not to be construed as limiting. For example, while embodiments may be described as comprising a plurality of features or elements, this is not to be construed as indicating that all those features or elements are necessary for an implementation. Instead, in other embodiments, some of these features or elements may be omitted and/or may be replaced by alternative features or elements. Furthermore, in addition to the features or elements explicitly shown in the drawings or described herein further features or elements may be provided, for example features or elements used in conventional System-on-Chip devices.

Features from different embodiments may be combined to form further embodiments. Variations and modifications described with respect to one of the embodiments may also be applied to other embodiments.

Any direct electrical connection or coupling shown in the drawings or described herein, i.e. any connection or coupling without any intervening elements, may also be realized by an indirect connection or coupling, i.e. a connection or coupling with one or more additional intervening elements, as long as the general purpose of the connection or coupling, for example to transmit a certain kind of signal or a certain kind of information or to provide a certain kind of control, is essentially maintained.

Some embodiments described in the following relate to the testing of non-volatile memories (NVM). A non-volatile memory generally is to be understood as a memory into which data may be written, and which maintains the data even if not supplied with current or voltage. Examples for such non-volatile memories include flash memories, EPROMs or EEPROMs. Testing in this respect relates to any act with which correct operation of a device may be evaluated. For memories like non-volatile memories, testing may involve writing of test data to the memory, and reading the test data from the memory.

Some embodiments relate to Systems-on-Chip. A System-on-Chip, also sometimes referred to as a System-on-a-Chip and generally abbreviated SoC is an integrated circuit that integrates all or at least most of the components of a computer or other electronic system into a single chip, i.e. on a single chip die. A System-on-Chip may contain digital, analog, mixed signal and/or radio-frequency functions on such a single chip die. A typical application is in the area of embedded systems.

Turning now to the figures, FIG. 1 shows a schematic block diagram illustrating a device 10 according to an embodiment. In some embodiments, device 10 may be implemented as a System-on-Chip, such that all or almost all elements of device 10, in particular the elements illustrated in FIG. 1, are provided on a single chip die. In other embodiments, elements shown in FIG. 1 may be implemented on separate chip dies and may for example be provided in a single semiconductor package.

Device 10 of FIG. 1 comprises a processor 11, other circuit parts 12 like interfaces, memories, drivers etc., a non-volatile memory 15 and a non-volatile memory (NVM) built-in self-test (BIST) circuit 14. The components are coupled via a bus 13 or other electrical connection in the embodiment of FIG. 1. Non-volatile memory 15 may for example be a flash memory, an EPROM or an EEPROM, but is not limited thereto. Processor 11 may be any kind of processor, for example a general purpose processor or a microcontroller.

A multiplexing entity 16 is provided. In a test mode, multiplexing entity 16 couples built-in self-test circuit 14 to non-volatile memory 15 and decouples built-in self-test circuit 14 and non-volatile memory 15 from bus 13. In regular operation, multiplexer 16 couples non-volatile memory 15 to bus 13, such that processor 11 can access non-volatile memory 15.

In the test mode, processor 11 may run programs to test other circuit parts 12. Moreover, BIST circuit 14 may test non-volatile memory 15 during at least some of the tests of other circuit parts 12 by processor 11, such that the testing is effectively performed in parallel and/or concurrently. In some embodiments, this may reduce the overall time needed for testing compared to cases where processor 11 performs testing of other circuit parts 12 and non-volatile memory 15 sequentially.

In some embodiments optionally, as indicated by a dashed line 17, processor 11 may suspend testing by BIST circuit 14 during certain parts of the testing of other circuit parts 12. This instructing may be via a dedicated communication connection in some embodiments, but in other embodiments may be performed via bus 13. In particular, during some phases of testing other circuit parts 12, conditions in device 10 may be taken outside an ordinary operating range (for example lowering or increasing of supply voltages to perform certain stress tests, changing a clocking of device 10 etc). Testing non-volatile memory 15 during such phases may distort the test results, as for example negative test results may not only result from faults of non-volatile memory 15, but may be caused by such test conditions used for testing other circuit parts 12. Therefore, during phases where such conditions are applied, testing by BIST circuit 14 may be suspended. In this suspension, a state of BIST circuit 14 may be "frozen", such that after the suspension of the testing the testing of non-volatile memory 15 may be resumed.

It should be noted that while BIST circuit 14 and non-volatile memory 15 are depicted as separate blocks in FIG. 1, they may also be integrated together. In this case, in some implementations multiplexer 16 may be omitted.

Figure 2:
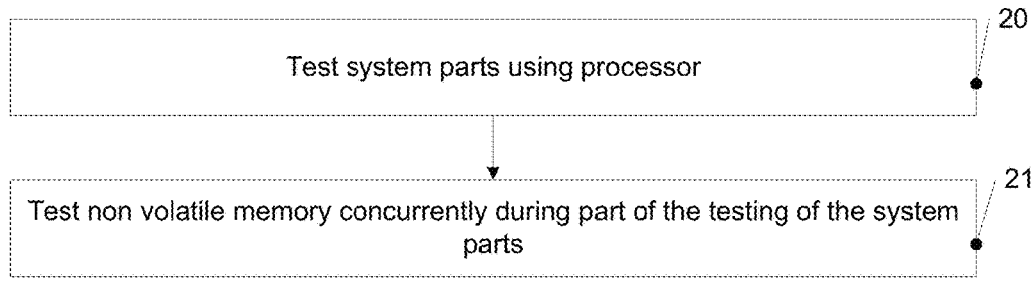
FIG. 2 is a flowchart illustrating a method according to an embodiment.

FIG. 2 is a flowchart illustrating a method according to an embodiment. The method of FIG. 2 may be performed in device 10 of FIG. 1, but may also be performed in other devices.

Nevertheless, for better understanding the method of FIG. 2 will be described referring to the device 10 of FIG. 1. This is not to be construed as limiting the method of FIG. 2 to device 10 of FIG. 1.

At 20 in FIG. 2, the method comprises testing system parts, for example other circuit parts 12, using a processor like processor 11 of FIG. 1.

At 21, the method comprises testing a non-volatile memory concurrently during part of the testing of the system parts at 20. In other parts of the testing of the system parts, testing of the non-volatile memory may be suspended, as explained referring to FIG. 1. Therefore, while 20 and 21 are depicted as successive operations in FIG. 2, they are in fact performed at least in part parallel to each other.

Figure 3:
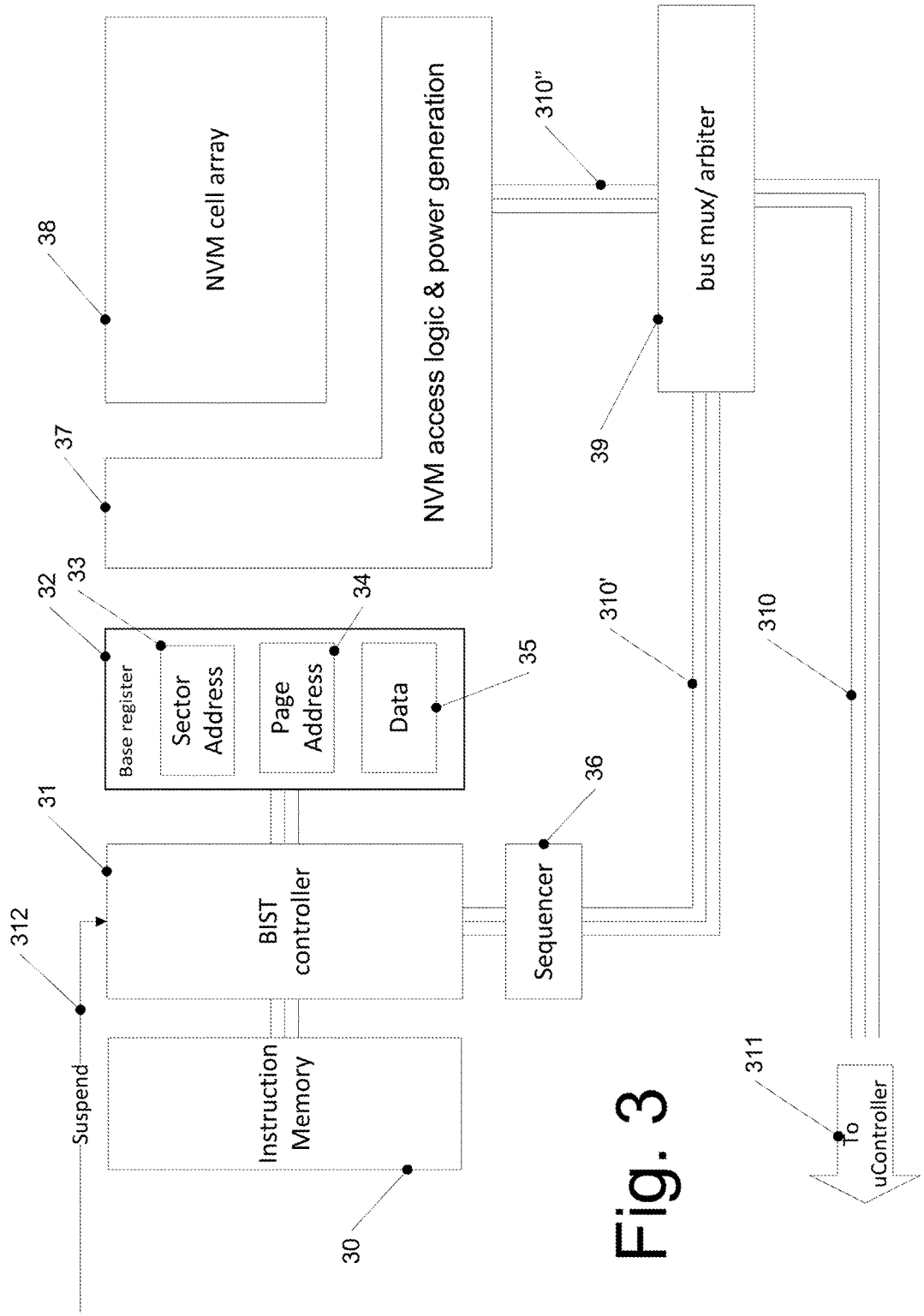
FIG. 3 is a detailed block diagram of a device according to an embodiment.

FIG. 3 is a block diagram of a part of a system or device according to an embodiment. In particular, FIG. 3 shows an implementation example for BIST circuit 14, multiplexer 16 and non-volatile memory 15 of device 10 of FIG. 1. However, the device part of FIG. 3 may also be used in other devices and systems than device 10 of FIG. 1.

The device of FIG. 3 comprises a bus 310, which, as indicated by an arrow 311, couples the components shown in FIG. 3 to a microcontroller or other controller, for example processor 11 of FIG. 1. Bus 310 may be an arbitrary host bus.

During normal operation, a bus multiplexer/arbiter 39 couples bus 310 to a bus portion 310", such as to couple a non-volatile memory to the microcontroller. The non-volatile memory in the embodiment of FIG. 3 comprises a non-volatile memory access logic and power generation 37 which compromises the logic to access a non-volatile memory cell array 38, in which the actual data is stored. Non-volatile memory 37, 38 in some embodiments may be implemented as a flash memory.

In a test mode of operation, bus multiplexer/arbiter 39 decouples bus 310 and couples a bus portion 310' to bus portion 310". This couples a built-in self-test (BIST) controller 31 which is provided for testing non-volatile memory 37, 38 to the non-volatile memory via a sequencer 36. BIST controller 38 is coupled to an instruction memory 30 comprising instructions to be executed in BIST controller 31 for testing non-volatile memory 37, 38. Examples for such instructions will be discussed later referring to FIGS. 7 and 8.

Furthermore, in the embodiment of FIG. 3 BIST controller 38 is coupled to a base register 32 which stores a sector address 33, a page address 34 and data 35. Sector address and page address identify a storage region in NVM cell array 38 to be tested. For example, flash memories are usually organized in sectors and pages. For a non-volatile memory having a different structure, base register 32 may be adapted to such a different structure. Furthermore, base register 32 comprises a data storage 35 storing data to be written to NVM cell array 38 or data read from NVM cell array 38.

In particular, BIST controller 31 for testing may perform write operations and read operations, thus testing NVM cell array 38. For example, a value may be written to the cell array 38 and then read again, and check if the data are consistent. Generally, during execution read-write commands may operate with four different data topologies in some embodiments, namely data reg/inverted data reg/solid 0/solid 1. In data reg, the content of data register 35 is written to the memory cell, and then e.g. read again and compared to the value in the data register. In inverted data reg, the inverted content of data register 35 is used. The content of the data register for this may be user configurable. In solid 0 or solid 1, fixed values of 0 and 1, respectively, are written to the cells (and then e.g. read out again and compared to the value originally written). The testing may be performed in different patterns over NVM cell array 38.

Furthermore, as indicated at 312, BIST controller 31 may be instructed to suspend testing during certain periods of time, in particular during certain phases of testing performed by a microcontroller for other circuit parts, as already explained with reference to FIGS. 1 and 2.

Furthermore, the embodiment of FIG. 3 comprises the sequencer 36. Sequencer 36 converts signals by BIST controller 31 to signals suitable for controlling non-volatile memory 37, 38. In other embodiments, sequencer 36 need not be provided as a separate entity, but its functionality may be implemented by software, hardware, firmware or combinations thereof in BIST controller 31.

In the embodiment of FIG. 3, NVM access logic and power generation 37 in some cases may not have an own controller. In other embodiments, NVM access logic may have an own controller. In such cases, this controller may also be used for testing, obviating the need for a separate BIST controller 31 in some embodiments. A corresponding embodiment is shown in FIG. 4.

Figure 4:
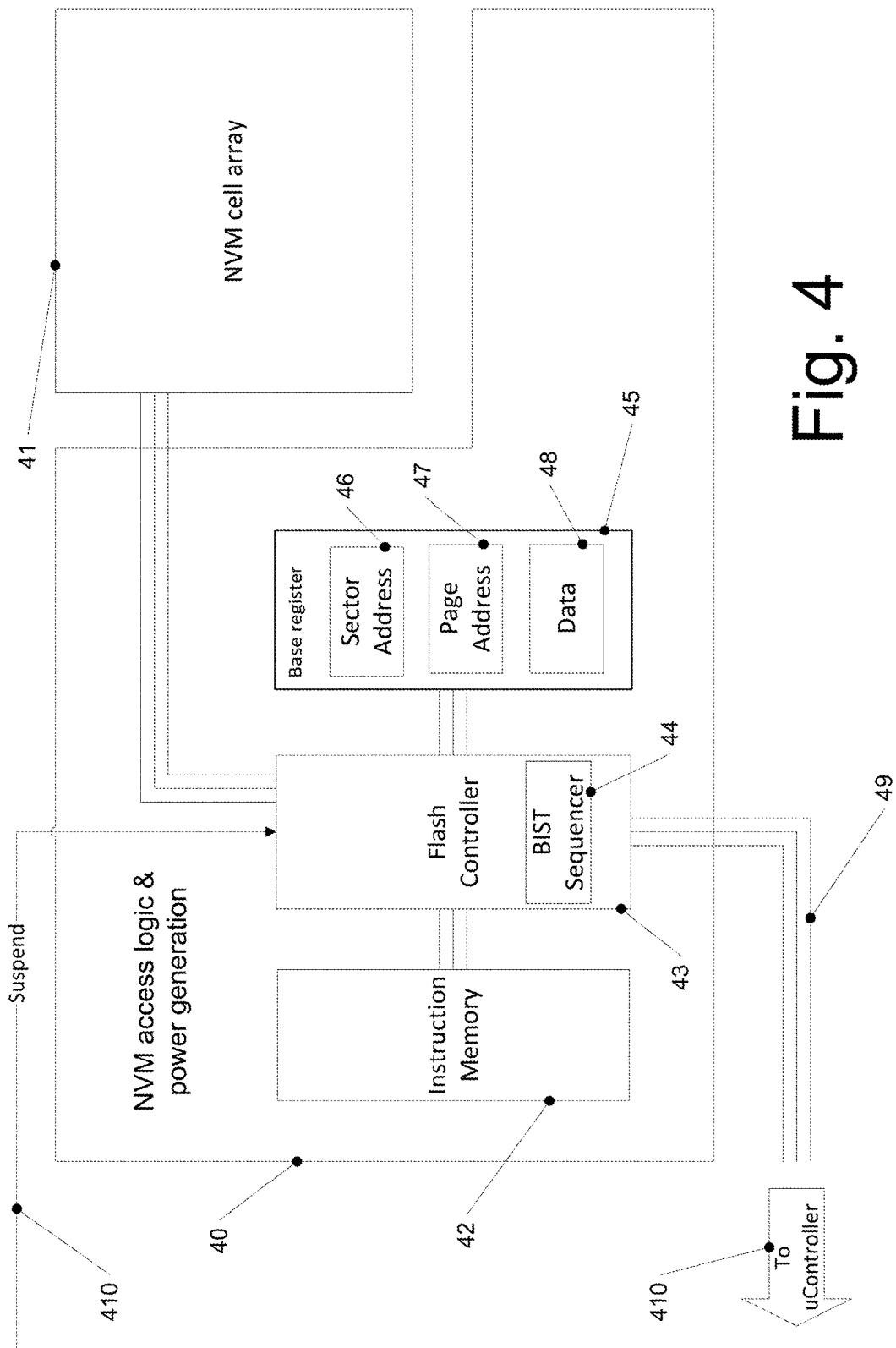
FIG. 4 is a detailed block diagram of a device according to another embodiment.

In the embodiment of FIG. 4, an NVM access logic and power generation circuit 40 is coupled to a microcontroller indicated by an arrow 410, for example processor 11 of FIG. 1, via a bus 49. Bus 49 may be an arbitrary host bus (AHB), but is not limited thereto.

In the embodiment of FIG. 4, NVM access logic and power generation 40 comprises a flash controller 43 which in normal operation is used to control access to an NVM cell array 41 comprising a plurality of non-volatile memory cells. In a test mode, flash controller 43 is also used to test NVM cell array 41, such that the testing need not be performed by a microcontroller or other processor.

To control NVM cell array 41 in a test mode, flash controller 43 is coupled to an instruction memory 42 comprising instructions for testing, and comprises a BIST sequencer 44 to output appropriate signals for testing to NVM cell array 41. Furthermore, flash controller 43 is coupled to a base register 45 comprising a storage for sector address (46), page address (47) and data (48) which for testing has the same function as base register 32 of FIG. 3. It should be noted that instruction memory 42 and base register 45 may also be used in normal operation for reading and writing data from and to NVM cell array 41, such that their use is not necessarily limited to testing.

Furthermore, as indicated by 410, testing by flash controller 43 may be suspended for example upon instructions from a microcontroller or other processor, in particular during phases where the microcontroller or other processor performs a testing of other circuit parts in a manner that could negatively influence testing of NVM test cell array 41, as explained previously.

Apart from the fact that for testing and internal flash controller of NVM access logic and power generation 40 is used and no bus multiplexer/arbiter is needed, testing using the embodiment of FIG. 4 may be performed in the same way as described previously for example with respect to FIG. 3, such that these details will not be described again.

Figure 5:
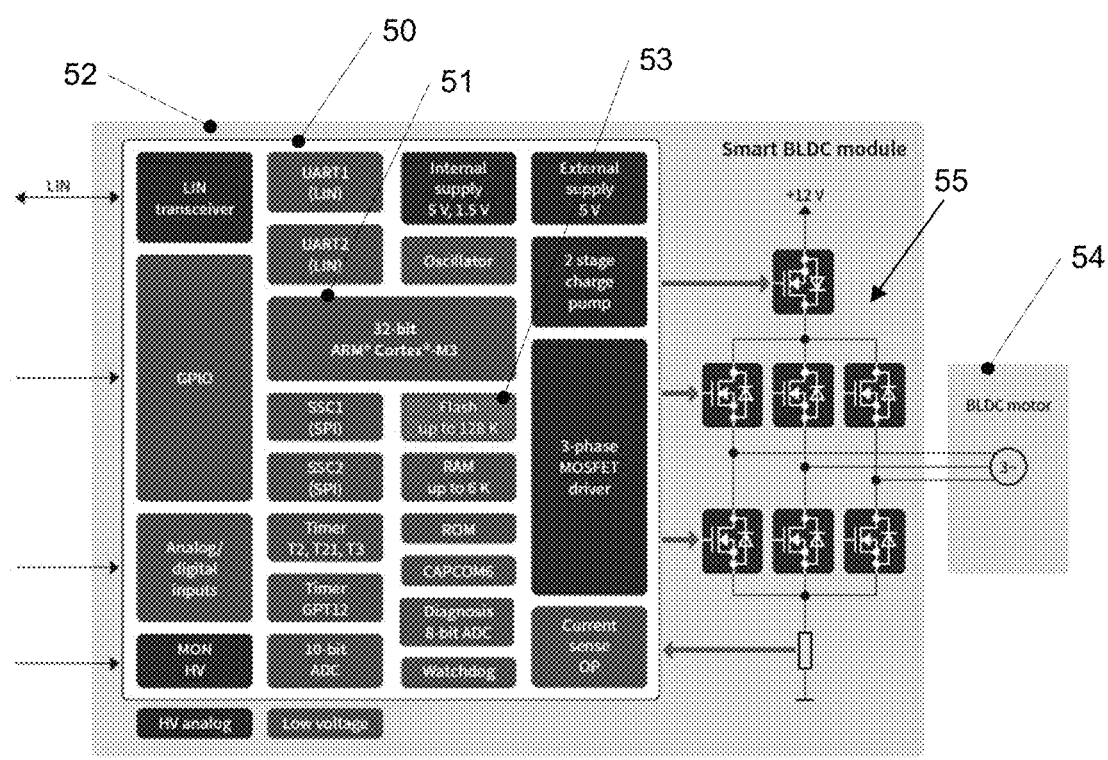
FIG. 5 is a diagram illustrating a device according to an embodiment.

FIG. 5 illustrates an example system in which techniques as discussed above with respect to FIGS. 1 to 4 may be implemented. While a specific system comprising specific functionalities is shown in FIG. 5, this is only for further illustration, and the techniques described above may also be implemented in other devices.

The system of FIG. 5 comprises a module 52 designed to control a three phase motor 54, which may in particular be a brushless direct current (BLDC) motor. To this end, module 52 comprises a plurality of transistor switches 55 controlled by a System-on-Chip 50. System-on-Chip 50 comprises a microcontroller 51 and a flash memory 53. Furthermore, System-on-Chip 50 comprises a plurality of other circuits like analog/digital inputs, analog-to-digital converters (ADCs), an operational amplifier (OP) for current sensing, a three-phase driver for driving switches 55, an oscillator, and internal supply voltage generation etc. For testing flash memory 53, techniques as discussed above may be used.

Figure 6A:
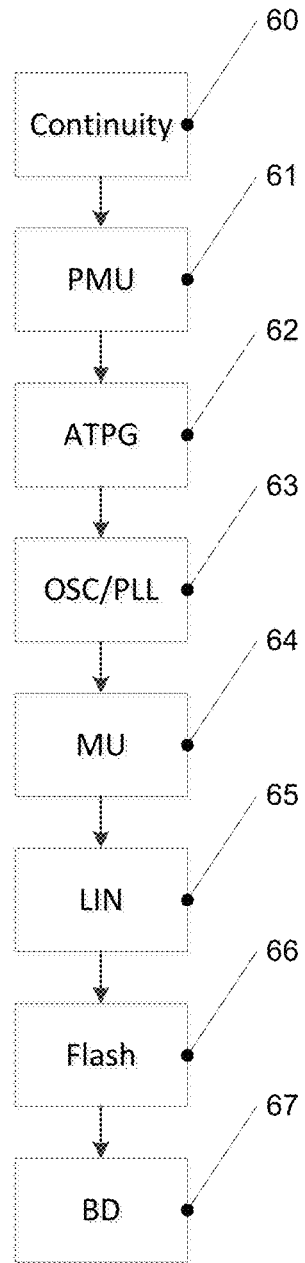
FIG. 6A is a flowchart illustrating a conventional testing method for the device of FIG. 5 given for comparison purposes.
Figure 6B:
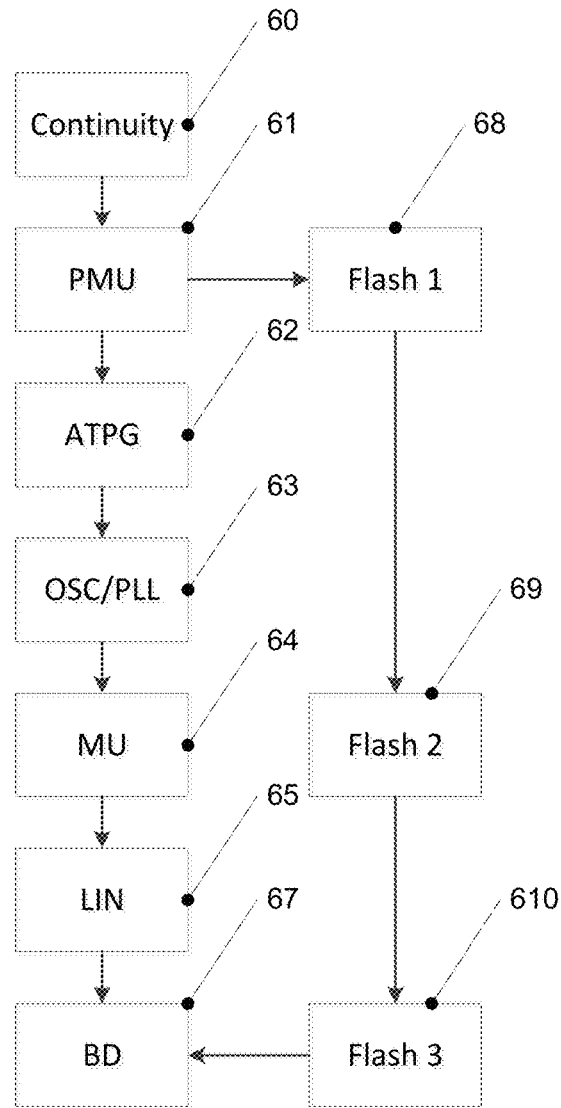
FIG. 6B is a flowchart illustrating a method according to an embodiment.

For further illustration, FIGS. 6A and 6B are flowcharts of testing procedures usable for testing system System-on-Chip 50 of FIG. 5. FIG. 6A illustrates a conventional testing procedure, while FIG. 6B illustrates a testing procedure according to an embodiment.

In FIG. 6A, conventional testing is performed by a processor like microcontroller 51 in FIG. 5 sequentially for all parts of the System-on-Chip 50 to be tested. At 60 labeled continuity, electrical contacts are tested. At 61, power measurement units and internal supply voltages are tested. At 62, the test flow comprises testing a digital part of the System-on-Chip. At 63, the testing comprises testing an oscillator and/or a PLL.

At 64, the testing comprises testing measurement units, for example analog-to-digital converters, of the System-on-Chip. At 65, the testing comprises testing linear serial interfaces of the System-on-Chip. At 66, the testing comprises testing a flash memory like flash memory 53 of FIG. 5. At 67, the method comprises testing bridge drivers, for example charge pumps and transistor drivers of System-on-Chip 50 of FIG. 5.

All the testing of FIG. 6A is performed sequentially by a processor (although the exact order may vary), and testing of the flash memory at 66 may take a comparatively long time and prolong testing due to slow access times of flash memories, as explained in the introductory portion.

FIG. 6B illustrates a testing according to an embodiment. Testing phases 60-65 and 67 correspond to testing phases 60-65 and 67 explained with reference to FIG. 6A and are performed sequentially by a processor, for example microcontroller 51 of FIG. 5. However, in contrast to FIG. 6A, flash testing is not performed in this sequence by a microcontroller, but is performed parallel thereto by a BIST controller or an internal memory controller like a flash controller, as illustrated with respect to FIGS. 3 and 4 for example. In the example of FIG. 6B, the flash testing is performed in three phases 68, 69 and 610, during which for example different parts of the memory, e.g. different memory cells, are tested. In the non-limiting example of FIG. 6B, the three phases 68, 69 and 610 are performed in parallel to testing phases 61, 64 and 67, respectively, while flash testing is suspended during phases 62, 63 and 65, for example due to conditions being applied during these phases which may adversely affect flash testing, as explained previously. The number of three flash testing phases 68, 69 and

610 in FIG. 6B and the other testing phases they are parallel to serve merely as examples, and depending on the device a different number of flash testing phases may be provided, and/or they may be distributed differently than shown in FIG. 6B.

Next, example commands and an example test procedure for a non-volatile memory will be discussed with reference to FIGS. 7 and 8. FIG. 7 is a table illustrating various commands, which may be identified by command codes 0-6. The commands may comprise a no operation (NOP) command, an erase command to erase a certain page, a certain sector or the complete memory, read and write commands to read or write a data request or an inverted data register, a solid zero or solid one, a jump command to jump to a different memory cell, a load command and a reset command.

FIG. 8 illustrates an example testing corresponding to a so-called March 5N pattern. In the March pattern, a cell is read and the result is evaluated (e.g. compared to an expected value). Next, the inverted (read) content is written to the cell, and an address used is incremented by one. This is repeated until a complete memory area to be tested is covered. In other embodiments, other testing algorithms usually used in memory testing may be used, for example a block write/read approach. In this approach, a test value is written to a cell, then an address is incremented by one, and the writing and incrementing is repeated until a complete memory area to be tested (e.g. a block) is covered. Then, the cells are read and evaluated following the same pattern.

Various data topologies may be used for such testing, like a checkerboard/inverse checkerboard pattern where values of 0 and 1 are written to a cell array in an alternating manner may be used. Generally, any conventional testing algorithms and data topologies may also be used in conjunction with the BIST testing discussed above.

The specific commands and the specific testing illustrated in FIGS. 7 and 8 serve only for further illustration, and in other embodiments other commands or other testing schemes may be used for testing non-volatile memories.

In view of the variations and various embodiments discussed above, it is evident that these embodiments serve as examples only and are not to be construed as limiting.

The following Examples are preferred embodiments of the inventions:

Example 1

A device, comprising:
a processor,
a non-volatile memory,
a test controller, and
at least one further circuit part,
wherein, in a test mode, the processor is configured to test the at least one further circuit part, and wherein the test controller is configured to test the non-volatile memory concurrently with at least part of the testing of the at least one further circuit part.

Example 2

The device of Example 1, wherein the device is implemented as a System-on-Chip.

Example 3

The device of Example 1, wherein the test controller is separate from the non-volatile memory.

Example 4

The device of Example 3, further comprising a bus system coupling the processor, the non-volatile memory and the at least one further circuit part, the device further comprising a multiplexer configured to the decouple the non-volatile memory from the processor during the test mode.

Example 5

The device of any one of Examples 1 or 2, wherein the test controller is incorporated in a memory controller of the non-volatile memory.

Example 6

The device of any one of Examples 1 to 5, wherein the test controller is configured to be suspended in order to suspend testing of the non-volatile memory.

Example 7

The device of Example 6, wherein the processor is configured to suspend the test controller during some phases of testing of the at least one further circuit part.

Example 8

The device of Example 7, wherein the some phases of testing comprise operating conditions negatively influencing testing of the non-volatile memory.

Example 9

The device of any one of Examples 1 to 8, wherein the non-volatile memory comprises a flash memory.

Example 10

A System-on-Chip, comprising:
a microcontroller,
a flash memory,
further circuits, and
a built-in self-test controller,
wherein the built-in self-test controller is configured to test the flash memory at least in part concurrently to the microcontroller testing at least some of the further circuits.

Example 11

The system of Example 10, wherein the built-in self-test controller is incorporated in a memory controller of the flash memory.

Example 12

The system of Example 10, wherein the built-in self-test controller is separate from the flash memory.

Example 13

The system of Example 12, further comprising a multiplexer decoupling the microcontroller from the flash memory during said testing.

Example 14

The system of any one of Examples 10 to 13, wherein the built-in self-test controller comprises a suspend input to temporarily suspend testing.

Example 15

A method, comprising:
testing system parts using a processor, and
testing a non-volatile memory concurrently during part of the testing of the system parts.

Example 16

The method of Example 15, further comprising temporarily suspending testing the non-volatile memory during another part of the testing of the system parts.

Example 17

The method of Example 16, further comprising, by the processor, setting testing conditions for the system parts during the another part of the testing which adversely affect testing of the non-volatile memory.

Example 18

The method of any one of Examples 15 to 17, wherein testing the non-volatile memory comprises testing the non-volatile memory according to one of a checkerboard pattern, an inverse checkerboard pattern, a March pattern and/or a block write/read.

Example 19

The method of any one of Examples 15 to 18, wherein testing the non-volatile memory comprises writing test data to the non-volatile memory, reading the test data from the non-volatile memory and comparing the read test data to test data to be written.

The invention claimed is:

1. A device, comprising:
a processor,
a non-volatile memory,
a test controller, and
at least one further circuit part,
wherein, in a test mode, the processor is configured to test the at least one further circuit part,
wherein the test controller is configured to test the non-volatile memory concurrently with at least part of the testing of the at least one further circuit part by the processor, and
wherein the processor is configured to suspend the test controller to suspend the testing of the non-volatile memory.

2. The device of claim 1, wherein the device is implemented as a System-on-Chip.

3. The device of claim 1, wherein the test controller is separate from the non-volatile memory.

4. The device of claim 3, further comprising a bus system coupling the processor, the non-volatile memory and the at least one further circuit part, the device further comprising a multiplexer configured to decouple the non-volatile memory from the processor during the test mode.

5. The device of claim 1, wherein the test controller is incorporated in a memory controller of the non-volatile memory.

6. The device of claim 1, wherein the processor is configured to suspend the test controller during some phases of testing of the at least one further circuit part by the processor.

7. The device of claim 6, wherein the some phases of testing comprise operating conditions negatively influencing testing of the non-volatile memory.

8. The device of claim 1, wherein the non-volatile memory comprises a flash memory.

9. A System-on-Chip, comprising:
a microcontroller,
a flash memory,
further circuits, and
a built-in self-test controller,
wherein the built-in self-test controller is configured to test the flash memory at least in part concurrently to the microcontroller testing at least some of the further circuits.

10. The system of claim 9, wherein the built-in self-test controller is incorporated in a memory controller of the flash memory.

11. The system of claim 9, wherein the built-in self-test controller is separate from the flash memory.

12. The system of claim 11, further comprising a multiplexer decoupling the microcontroller from the flash memory during said testing.

13. The system of claim 9, wherein the built-in self-test controller comprises a suspend input to temporarily suspend testing.

14. A method, comprising:
testing system parts using a processor,
testing a non-volatile memory concurrently during part of the testing of the system parts, and
temporarily suspending, by the processor, the testing of the non-volatile memory during another part of the testing of the system parts.

15. The method of claim 14, further comprising, by the processor, setting testing conditions for the system parts during the another part of the testing of the system parts which adversely affects testing of the non-volatile memory.

16. The method of claim 14, wherein testing the non-volatile memory comprises testing the non-volatile memory according to one of a checkerboard pattern, an inverse checkerboard pattern, a March pattern, or a block write/read.

17. The method of claim 14, wherein testing the non-volatile memory comprises writing test data to the non-volatile memory, reading the test data from the non-volatile memory, and comparing the read test data read from the non-volatile memory to test data to be written.

18. The device of claim 4, wherein the multiplexer is configured to:
couple the test controller to the non-volatile memory in the test mode;
decouple the test controller from the bus system in the test mode;
decouple the non-volatile memory from the bus system in the test mode; and
couple the non-volatile memory to the bus system during regular operation such that processor can access the non-volatile memory.

19. The system of claim 12, further comprising a bus system coupling the microcontroller, the flash memory, and the further circuits, wherein the multiplexer is configured to:
  couple the built-in self-test controller to the flash memory during the testing of the flash memory;
  decouple the built-in self-test controller from the bus system during the testing of the flash memory;
  decouple the flash memory from the bus system during the testing of the flash memory; and
  couple the flash memory to the bus system during regular operation such that microcontroller can access the flash memory.

20. The method of claim 14,
wherein testing the non-volatile memory comprises testing the non-volatile memory using a test controller,
wherein the method further comprises:
  coupling the test controller to the non-volatile memory during the testing of the non-volatile memory;
  decoupling the test controller from a bus system during the testing of the non-volatile memory;
  decoupling the non-volatile memory from the bus system during the testing of the non-volatile memory; and
  coupling the non-volatile memory to the bus system during regular operation such that processor can access the non-volatile memory.

* * * * *